(12) United States Patent
Hashizume

(10) Patent No.: US 12,321,089 B2
(45) Date of Patent: Jun. 3, 2025

(54) WAVELENGTH CONVERSION ELEMENT, LIGHT SOURCE DEVICE, AND PROJECTOR

(71) Applicant: SEIKO EPSON CORPORATION, Tokyo (JP)

(72) Inventor: Toshiaki Hashizume, Okaya (JP)

(73) Assignee: SEIKO EPSON CORPORATION, Tokyo (JP)

( * ) Notice: Subject to any disclaimer, the term of this patent is extended or adjusted under 35 U.S.C. 154(b) by 630 days.

(21) Appl. No.: 17/694,826

(22) Filed: Mar. 15, 2022

(65) Prior Publication Data

US 2022/0291576 A1 Sep. 15, 2022

(30) Foreign Application Priority Data

Mar. 15, 2021 (JP) ................................ 2021-041089

(51) Int. Cl.
| | |
|---|---|
| *G02B 21/20* | (2006.01) |
| *G03B 21/20* | (2006.01) |
| *H01L 33/50* | (2010.01) |
| *H04N 9/31* | (2006.01) |
| *H10H 20/851* | (2025.01) |

(52) U.S. Cl.
CPC ....... *G03B 21/204* (2013.01); *G03B 21/2013* (2013.01); *H04N 9/3161* (2013.01); *H10H 20/8512* (2025.01); *H10H 20/8514* (2025.01); *H10H 20/8515* (2025.01)

(58) Field of Classification Search
CPC .. H04N 9/3158; H04N 9/3152; H01L 33/502; G03B 21/204
See application file for complete search history.

(56) References Cited

U.S. PATENT DOCUMENTS

| | | | |
|---|---|---|---|
| 10,324,247 B2 | 6/2019 | Hikmet et al. | |
| 11,300,862 B2* | 4/2022 | Chen | .................... G03B 21/204 |
| 2018/0143368 A1 | 5/2018 | Hikmet et al. | |
| 2021/0297641 A1* | 9/2021 | Yotsuya | ............... H04N 9/3167 |

FOREIGN PATENT DOCUMENTS

| | | |
|---|---|---|
| JP | 2003-295319 A | 10/2003 |
| JP | 2018-517249 A | 6/2018 |

* cited by examiner

*Primary Examiner* — Joseph L Williams
(74) *Attorney, Agent, or Firm* — Dority & Manning, P.A.

(57) ABSTRACT

A wavelength conversion element includes a wavelength conversion layer configured to convert first light in a first wavelength band into second light in a second wavelength band different from the first wavelength band, the wavelength conversion layer including a scattering element no higher than 5% in volume ratio and having a first surface, a second surface intersecting the first surface, and a third surface intersecting the second surface and different from the first surface, an optical element including glass having a first refractive index lower than a second refractive index of the wavelength conversion layer, the optical element having contact with the first surface and the second surface, and a low-refractive index layer having a third refractive index lower than the first refractive index of the glass, the low-refractive index layer having contact with the third surface.

13 Claims, 5 Drawing Sheets

WAVELENGTH CONVERSION ELEMENT, LIGHT SOURCE DEVICE, AND PROJECTOR

The present application is based on, and claims priority from JP Application Serial Number 2021-041089, filed Mar. 15, 2021, the disclosure of which is hereby incorporated by reference herein in its entirety.

BACKGROUND

1. Technical Field

The present disclosure relates to a wavelength conversion element, a light source device, and a projector.

2. Related Art

In the past, there has been known an optical device for converting incident light having a first wavelength into light having a second wavelength (see, e.g., JP-T-2018-517249 (Document 1)).

The optical device described in Document 1 is provided with a light conversion member and a light guide. The light conversion member is a reflective light conversion member for converting incident blue light into yellow light.

The light conversion member has a wavelength conversion element having a phosphor material, and a reflective heat-conducting element for reflecting the blue light and fluorescence. The wavelength conversion element and the heat-conducting element are chemically coupled to each other, and thus, the wavelength conversion element makes thermal contact with the heat-conducting element. It should be noted that as the phosphor material, there is illustrated an inorganic phosphor material including YAG:Ce.

The light guide is a composite parabolic collector to chemically be coupled to the wavelength conversion element. The light guide has a light entrance and a light exit, and guides the blue light entering the light entrance to the light conversion member, and guides the yellow light emitted from the light conversion member and the blue light reflected by the light conversion member to the light exit. The heat generated in the wavelength conversion element is distributed to the light guide, and thus, the thermal load of the wavelength conversion element is reduced.

In the phosphor layer including the phosphor material, in the internal scattering using a scattering element such as air holes included inside, excitation light for exciting the phosphor material and the fluorescence obtained by the phosphor material converting the excitation light are emitted from a surface of the phosphor layer while colliding with the scattering element. On this occasion, reciprocation of the light inside the phosphor layer increases to frequently generate reabsorption of the light by the phosphor material, which causes a luminous efficiency of the fluorescence in the phosphor layer to decrease.

Due to such a problem, in the optical device described in Document 1, when the wavelength conversion element includes the air holes inside, there a possibility that the use efficiency of the excitation light and the extraction efficiency of the fluorescence decrease. In other words, in the wavelength conversion element provided with the wavelength conversion layer including the scattering element such as the air holes, there is a problem that the use efficiency of the excitation light and the extraction efficiency of the fluorescence are apt to be low.

SUMMARY

A wavelength conversion element according to a first aspect of the present disclosure includes a wavelength conversion layer configured to convert first light in a first wavelength band into second light in a second wavelength band different from the first wavelength band, the wavelength conversion layer including a scattering element no higher than 5% in volume ratio and having a first surface, a second surface intersecting the first surface, and a third surface intersecting the second surface and different from the first surface, an optical element including glass having a first refractive index lower than a second refractive index of the wavelength conversion layer, the optical element having contact with the first surface and the second surface, and a low-refractive index layer having a third refractive index lower than the first refractive index of the glass, the low-refractive index layer having contact with the third surface.

A light source device according to a second aspect of the present disclosure includes a light source configured to emit the first light, and the wavelength conversion element according to the first aspect described above which the first light emitted from the light source enters.

A projector according to a third aspect of the present disclosure includes the light source device according to the second aspect described above, a light modulator configured to modulate light emitted from the light source device in accordance with image information, and a projection optical device configured to project the light modulated by the light modulation device.

DESCRIPTION OF EXEMPLARY EMBODIMENTS

In the specification and the drawings, elements having substantially the same functions and configurations are denoted by the same reference symbols to thereby omit redundant descriptions.

In the present specification, a principal component means a component the largest in proportion of the components of a composition.

First Embodiment

A first embodiment of the present disclosure will hereinafter be described based on the drawings.

Schematic Configuration of Projector

Figure 1:
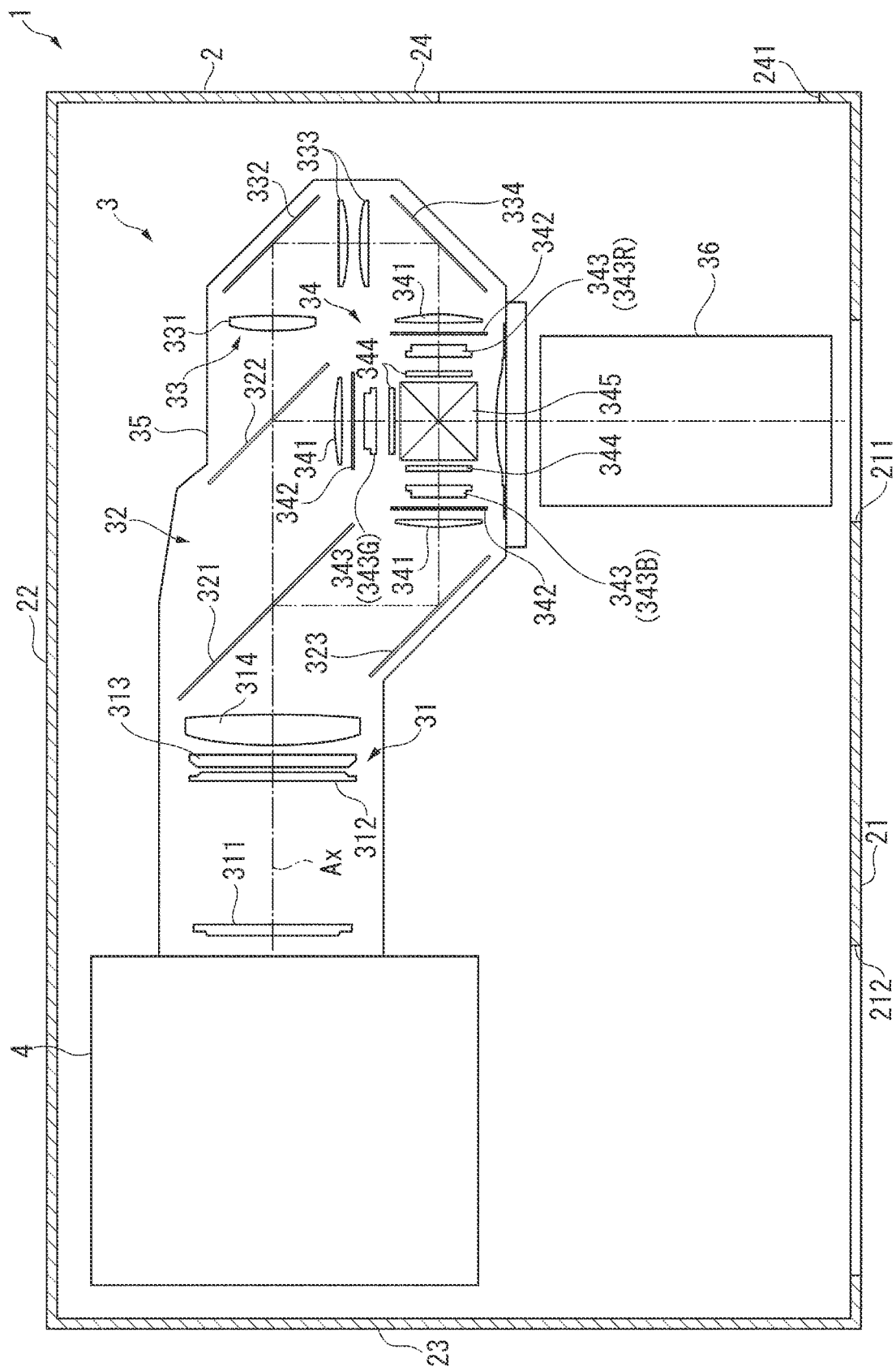
FIG. 1 is a schematic diagram showing a configuration of a projector according to a first embodiment.

FIG. 1 is a schematic diagram showing a configuration of a projector 1 according to the present embodiment.

The projector 1 according to the present embodiment modulates light emitted from a light source device 4 described later to form an image corresponding to image information, and then projects the image thus formed in an enlarged manner on a projection target surface such as a screen. As shown in FIG. 1, the projector 1 is provided with an exterior housing 2, and an image projection device 3 disposed in the exterior housing 2. Besides the above, although not shown in the drawings, the projector 1 is provided with a control device for controlling operations of the projector 1, a power supply device for supplying electronic components with electrical power, and a cooling device for cooling a cooling target.

Configuration of Exterior Housing

The exterior housing 2 configures an exterior of the projector 1. The exterior housing 2 houses the image projection device 3, the control device, the power supply device, and the cooling device. The exterior housing 2 has a top surface part and a bottom surface part not shown, a front surface part 21, a back surface part 22, a left side surface part 23, and a right side surface part 24, and is formed to have a substantially rectangular solid shape.

The front surface part 21 has an opening part 211 for exposing a part of a projection optical device 36 described later, and an image to be projected by the projection optical device 36 passes through the opening part 211. Further, the front surface part 21 has an exhaust port 212 from which a cooling gas having cooled the cooling target in the projector 1 is discharged to the outside of the exterior housing 2. Further, the right side surface part 24 has an introduction port 241 from which a gas located outside the exterior housing 2 is introduced inside as the cooling gas.

Configuration of Image Projection Device

The image projection device 3 forms and then projects the image corresponding to the image information. The image projection device 3 is provided with a light source device 4, a homogenizing device 31, color separation device 32, a relay device 33, an image forming device 34, an optical component housing 35, and the projection optical device 36.

The light source device 4 emits light. A configuration of the light source device 4 will be described later in detail.

The homogenizing device 31 homogenizes the light emitted from the light source device 4. The light thus homogenized by the homogenizing device 31 illuminates modulation areas of light modulation devices 343 described later of the image forming device 34 via the color separation device 32 and the relay device 33. The homogenizing device 31 is provided with two lens arrays 311, 312, a polarization conversion element 313, and a superimposing lens 314.

The color separation device 32 separates the light having entered the color separation device 32 from the homogenizing device 31 into colored light beams of red, green, and blue. The color separation device 32 is provided with two dichroic mirrors 321, 322 and a reflecting mirror 323 for reflecting the blue light beam having been separated by the dichroic mirror 321.

The relay device 33 is disposed in a light path of the red light beam longer than a light path of the blue light beam and a light path of the green light beam to suppress a loss of the red light beam. The relay device 33 is provided with an incident side lens 331, relay lenses 333, and reflecting mirrors 332, 334.

It should be noted that although the relay device 33 is disposed in the light path of the red light beam, this is not a limitation, and it is also possible to adopt a configuration in which, for example, the colored light beam longer in light path than other colored light beams is set to the blue light beam, and the relay device 33 is disposed in the light path of the blue light beam.

The image forming device 34 modulates each of the colored light beams of red, green, and blue having entered the image forming device 34, and combines the colored light beams thus modulated with each other to form the image to be projected by the projection optical device 36. The image forming device 34 is provided with three field lenses 341, three incident side polarization plates 342, three light modulation devices 343, and three exit side polarization plates 344 each disposed in accordance with the respective colored light beams entering the image forming device 34, and a single color combining device 345.

The light modulation devices 343 each modulate the light emitted from the light source device 4 in accordance with the image information. The three light modulation devices 343 include the light modulation device 393R for modulating the red light beam, the light modulation device 343G for modulating the green light beam, and the light modulation device 343B for modulating the blue light beam. In the present embodiment, the light modulation devices 343 are each formed of a transmissive liquid crystal panel, and the incident side polarization plate 342, the light modulation device 343, and the exit side polarization plate 344 constitute a liquid crystal light valve.

The color combining device 345 combines the colored light beams respectively modulated by the light modulation devices 343B, 343G, and 343R with each other to form the image described above. In the present embodiment, the color combining device 345 is formed of a cross dichroic prism, but this is not a limitation, and it is also possible for the color combining device 345 to be constituted by, for example, a plurality of dichroic mirrors.

The optical component housing 35 houses the homogenizing device 31, the color separation device 32, the relay device 33, and the image forming device 34 inside. It should be noted that an illumination light axis Ax as a design optical axis is set in the image projection device 3, and the optical component housing 35 holds the homogenizing device 31, the color separation device 32, the relay device 33, and the image forming device 34 at predetermined positions on the illumination light axis Ax. The light source device 4 and the projection optical device are disposed at predetermined positions on the illumination light axis Ax.

The projection optical device 36 projects the image having entered the projection optical device 36 from the image forming device 34 on the projection target surface in an enlarged manner. In other words, the projection optical device 36 projects the light beams having respectively been modulated by the light modulation devices 343B, 343G, and 343R. The projection optical device 36 is configured as a combination lens having, for example, a plurality of lenses housed in a lens tube having a cylindrical shape.

Configuration of Light Source Device

Figure 2:
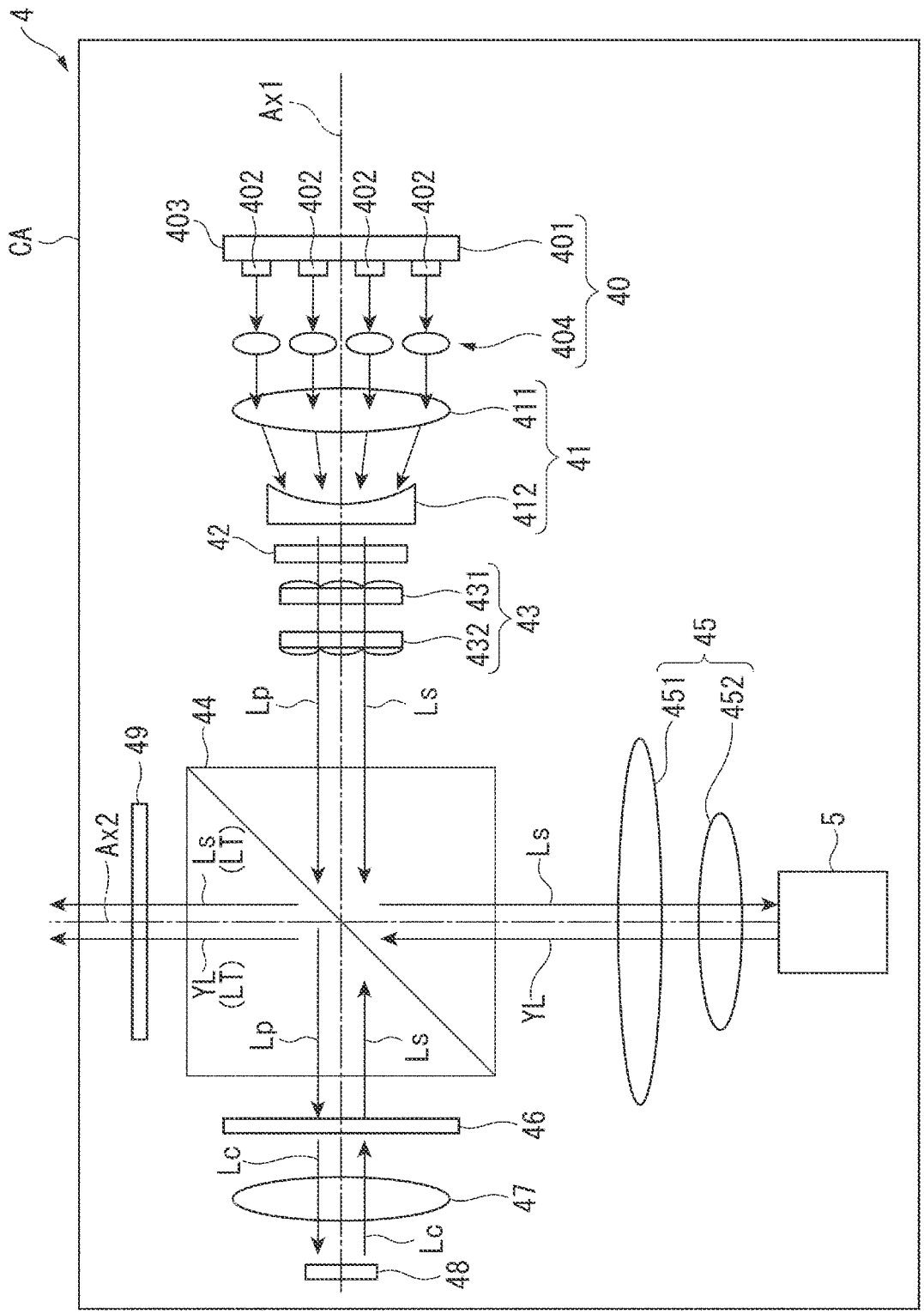
FIG. 2 is a diagram showing a configuration of a light source device according to the first embodiment.

FIG. 2 is a schematic diagram showing the light source device 4.

The light source device 4 emits illumination light LT for illuminating the light modulation devices 343 to the homogenizing device 31. As shown in FIG. 2, the light source device 4 is provided with a light source housing CA, and a light source section 40, an afocal optical element 41, a first retardation element 42, a homogenizer optical element 43, a light split element 44, a first light collection element 45, a second retardation element 46, a second light collection element 47, a diffusely reflecting device 48, a third retardation element 49, and a wavelength conversion element 5 all housed in the light source housing CA.

In the following description, three directions perpendicular to each other are defined as a +X direction, a +Y direction, and a +Z direction, respectively. The +X direction out of the three directions is defined as a direction in which the light source device 4 emits the illumination light LT. Further, although not shown in the drawings, an opposite direction to the +X direction is defined as a −X direction, an opposite direction to the +Y direction is defined as a −Y direction, and an opposite direction to the +Z direction is defined as a −Z direction.

The light source housing CA is a sealed housing which is difficult for dust or the like to invade. In the light source housing CA, there are set an illumination light axis Ax1 along the +Z direction and an illumination light axis Ax2 along the +X direction. In other words, the illumination light axis Ax1 and the illumination light axis Ax2 are perpendicular to each other.

The light source section 40, the afocal optical element 41, the first retardation element 42, the homogenizer optical element 43, the light split element 44, the second retardation element 46, the second light collection element 47, and the diffusely reflecting device 48 are disposed on the illumination light axis Ax1.

The wavelength conversion element 5, the first light collection element 45, the light split element 44, and the third retardation element 49 are disposed on the illumination light axis Ax2. The light split element 44 is disposed at a cross portion between the illumination light axes Ax1, Ax2.

Configuration of Light Source Section

The light source section 40 is provided with a light source 401 for emitting the light, and collimator lenses 404.

The light source 401 is provided with a plurality of solid-state light emitting elements 402, and a support member 403.

The solid-state light emitting elements 402 are each a solid-state light source for emitting a blue light beam which is s-polarized light as excitation light. In more detail, the solid-state light emitting elements 402 are each a semiconductor laser, and the blue light beam emitted by each of the solid-state light emitting elements 402 is a laser beam having a peak wavelength of, for example, 440 nm. It should be noted that the s-polarized light is s-polarized light for the light split element 44, and p-polarized light is p-polarized light for the light split element 44.

The support member 403 supports the plurality of solid-state light emitting elements 402 arranged in an array on a plane perpendicular to the illumination light axis Ax1. The support member 403 is a metallic member having thermal conductivity.

The blue light beams having been emitted from the plurality of solid-state light emitting elements 402 are converted by the collimator lenses 404 into parallel light beams, and then enter the afocal optical element 41.

It should be noted that in the present embodiment, the light source 401 emits the blue light beams which are linearly polarized light beams the same in polarization direction. However, this is not a limitation, and the light source 401 can also be provided with a configuration of emitting blue light beams as s-polarized light and the blue light beams as p-polarized light. In this case, the first retardation element 42 can be omitted.

Configuration of Afocal Optical Element

The afocal optical element 41 adjusts the light flux diameter of the blue light beams which enter the afocal optical element 41 from the light source section 40. The afocal optical element 41 is constituted by a lens 411 for collecting the incident light, and a lens 412 for collimating the light beams collected by the lens 411. It should be noted that the afocal optical element 41 can be eliminated.

Configuration of First Retardation Element

The first retardation element 42 is disposed between the afocal optical element 41 and the homogenizer optical element 43. The first retardation element 42 converts the linearly polarized light of the single kind having entered the first retardation element 42 into light including a blue light beam Ls as the s-polarized light and a blue light beam Lp as the p-polarized light. The first retardation element 42 can be rotated by a rotating device centering on a rotational axis along the illumination light axis Ax1. In this case, the ratio between the blue light beam Ls and the blue light beam Lp in the light beam emitted from the first retardation element 42 can be adjusted in accordance with a rotational angle of the first retardation element 42.

Configuration of Homogenizer Optical Element

The homogenizer optical element 43 homogenizes an illuminance distribution of the blue light beams Ls, Lp entering the homogenizer optical element 43 from the afocal optical element 41 via the first retardation element 42. The homogenizer optical element 43 is formed of a pair of multi-lens arrays 431, 432.

It should be noted that instead of the homogenizer optical element 43, it is possible to adopt a diffusely transmitting element which diffuses the incident light in the process of transmitting the incident light to thereby homogenize the angle distribution of the light emitted. As the diffusely transmitting element, it is possible to illustrate configuration having a hologram, a configuration in which a plurality of small lenses arranged on a plane perpendicular to the light axis, and a configuration in which the surface through which the light passes is a coarse surface.

Configuration of Light Split Element

The blue light beams Ls, Lp having passed through the homogenizer optical element 43 enter the light split element 44.

The light split element 44 is a prism-type polarization beam splitter, and separates an s-polarization component and a p-polarization component included in the incident light from each other. Specifically, the light split element 44 reflects the s-polarization component, and transmits the p-polarization component. Further, the light split element 44 has a color separation characteristic of transmitting light with the wavelength no shorter than a predetermined wavelength irrespective of whether the polarization component is the s-polarization component or the p-polarization component. Therefore, the blue light beam Ls as the s-polarized light is reflected by the light split element 44, and then enters the first light collection element 45. Meanwhile, the blue light beam Lp as the p-polarized light is transmitted through the light split element 44, and then enters the second retardation element 46.

It should be noted that it is possible for the light split element 44 to have a function of a half mirror which transmits about one fifth of light entering the light split element 44 from the light source section 40 via the homogenizer optical element 43, and reflects the rest of the light, and a function of a dichroic mirror which reflects the blue light entering the light split element 44 from the diffusely reflecting device 48, and transmits light entering the light split element 44 from the wavelength conversion element 5 and having a wavelength longer than the wavelength of the blue light. In this case, the first retardation element 42 can be omitted.

Configuration of First Light Collection Element

The first light collection element 45 converges the blue light beam Ls having been reflected by the light split element 44 on the wavelength conversion element 5. Further, the first light collection element 45 collimates fluorescence YL entering the first light collection element 45 from the wavelength conversion element 5, and then emits the fluorescence YL thus collimated to the light split element 44. Although the first light collection element 45 is constituted by two lenses

451, 452 in the example shown in FIG. 2, the number of the lenses constituting the first light collection element 45 does not matter.

Configuration of Wavelength Conversion Element

The wavelength conversion element 5 converts first light in a first wavelength band into second light in a second wavelength band different from the first wavelength band. Specifically, the wavelength conversion element 5 converts the blue light beam Ls which enters the wavelength conversion element 5 along the −X direction into the fluorescence YL, and then emits the fluorescence YL toward the +X direction. The blue light beam Ls corresponds to the first light in the first wavelength band, and the fluorescence YL corresponds to the second light in the second wavelength band different from the first wavelength band. In more detail, the wavelength conversion element 5 is excited by the blue light beam Ls as the excitation light entering the wavelength conversion element 5, and then emits the fluorescence YL having the wavelength longer than the wavelength of the blue light beam Ls having entered the wavelength conversion element 5. The fluorescence YL is, for example, light having a peak wavelength in a range of 500 through 700 nm. In other words, the fluorescence YL includes the green light beam and the red light beam.

It should be noted that the configuration of the wavelength conversion element 5 will be described later in detail.

Configuration of Second Retardation Element and Second Light Collection Element

The second retardation element 46 is a ¼ wave plate with respect to the blue light beam Lp, and is disposed between the light split element 44 and the second light collection element 47. The second retardation element 46 converts the blue light beam Lp having passed through the light split element 44 into a blue light beam Lc as circularly polarized light. The blue light beam Lc enters the second light collection element 47.

The second light collection element 47 converges the blue light beam Lc which enters the second light collection element 47 from the second retardation element 46, and is reversed in polarization rotation direction on the diffusely reflecting device 48. Further, the second light collection element 47 collimates the blue light beam Lc which enters the second light collection element 47 from the diffusely reflecting device 48. It should be noted that the number of lenses constituting the second light collection element 47 can arbitrarily be changed.

Configuration of Diffusely Reflecting Device

The diffusely reflecting device 48 reflects and diffuses the blue light beam Lc entering the diffusely reflecting device 48 at substantially the same diffusion angle as that of the fluorescence YL emitted from the wavelength conversion element 5. The diffusely reflecting device 48 has a reflecting member for causing Lambertian reflection of the blue light beam Lc having entered the diffusely reflecting device 48. It should be noted that it is possible for the diffusely reflecting device 48 to be provided with a rotary device for rotating a reflecting member centering on a rotational axis parallel to the illumination light axis Ax1.

The blue light beam Lc having diffusely been reflected by the diffusely reflecting device 45 passes through the second light collection element 47, and then enters the second retardation element 46. The blue light beam Lc is converted into circularly polarized light with the opposite rotational direction when being reflected by the diffusely reflecting device 48. Therefore, the blue light beam Lc entering the second retardation element 46 via the second light collection element 47 is converted by the second retardation element 46 into the blue light beam Ls as the s-polarized light. Then, the blue light beam Ls is reflected by the light split element 44 to enter the third retardation element 49. In other words, the light which enters the third retardation element 49 from the light split element 44 is white light having the blue light beam Ls and the fluorescence YL mixed with each other.

Configuration of Third Retardation Element

The blue light beam Ls having been reflected toward the +X direction by the light split element 44 and the fluorescence YL having passed through the light split element 44 toward the +X direction enter the third retardation element 49. In other words, the white light obtained by the light split element 44 combining the blue light beam Ls and the fluorescence YL with each other enters the third retardation element 49.

The third retardation element 49 converts the white light which has entered the third retardation element into light having the s-polarized light and the p-polarized light mixed with each other. The illumination light LT which has a white color and has been converted in such a manner enters the homogenizing device 31 described above.

Configuration of Wavelength Conversion Element

Figure 3:
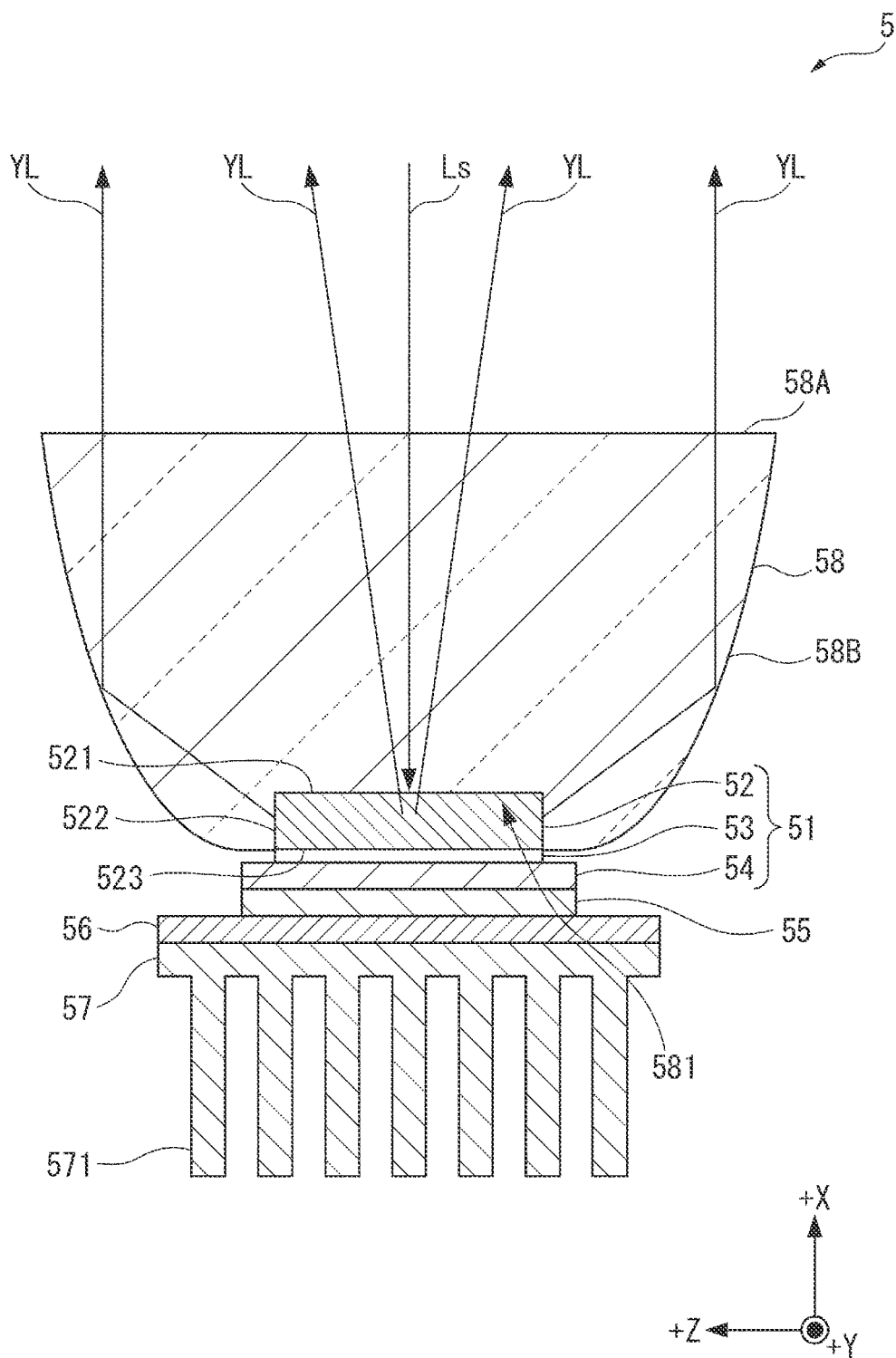
FIG. 3 is a schematic diagram showing a configuration of a wavelength conversion element according to the first embodiment.

FIG. 3 is a schematic diagram showing a configuration of the wavelength conversion element 5.

As described above, the wavelength conversion element 5 is a reflective wavelength conversion element which converts the blue light beam Ls entering the wavelength conversion element 5 along the −X direction into the fluorescence YL, and then emits the fluorescence YL toward the incident side of the blue light beam Ls. As shown in FIG. 3, the wavelength conversion element 5 is provided with an optical layer 51, a jointing layer 55, a support body 56, a radiation member 57, and an optical element 58.

Configuration of Optical Layer

The optical layer 51 is provided with a wavelength conversion layer 52, a low-refractive index layer 53, and a reflecting layer 54. The optical layer 51 is supported by the support body 56 bonded with the jointing layer 55.

Configuration of Wavelength Conversion Layer

The wavelength conversion layer 52 converts the first in the first wavelength band into the second light in the second wavelength band different from the first wavelength band. In other words, the blue light beam Ls is converted into the fluorescence YL. In the present embodiment, the wavelength conversion layer 52 is a polycrystalline body including a YAG:Ce phosphor material doped with Ce as an activator. However, the phosphor material included in the wavelength conversion layer 52 can be a phosphor material such as a phosphor material obtained by replacing Y in the YAG phosphor with Lu or Gd, and replacing Al with Ga, a Y(AlGa)G phosphor material, a GdYAG phosphor material, a KSF phosphor material, a lanthanum silicon nitride phosphor material, an SCASN phosphor material, or a CASN phosphor material, or can also be a mixture of a plurality of phosphor materials. Further, as the activator, there can be cited, for example, Eu, Pr, Cr, Gd, and Ga besides Ce.

Here, when the activator concentration (e.g., the Ce concentration) in the phosphor material increases, the transparency of the wavelength conversion layer 52 deteriorates, and scattering of light occurs inside the wavelength conversion layer 52. Therefore, the Ce concentration of the wavelength conversion layer 52 is preferably no higher than 1%, and is more preferably no lower than 0.1% and no higher than 0.5%.

The wavelength conversion layer 52 includes air holes as the scattering element, and the content rate of the air holes is no higher than 5% in volume ratio of the wavelength conversion layer 52. In the present embodiment, the lower the content rate of the scattering element in the wavelength conversion layer 52 the better, and it is preferable for the wavelength conversion layer 52 not to include the scattering element. In other words, the content rate of the air holes in the wavelength conversion layer 52 is preferably no higher than 0.1%, and is more preferably equal to 0%.

The linear expansion coefficient of the wavelength conversion layer 52 is, for example, $8.0 \times 10^{-6}$.

The wavelength conversion layer 52 has a first surface 521, a second surface 522, and a third surface 523.

The first surface 521 is a surface facing to the +X direction. The blue light beam Ls enters the first surface 521 via the optical element 58. In other words, the first surface 521 is a plane of incidence which the blue light beam Ls as the excitation light enters.

The second surface 522 is a side surface crossing the first surface 521.

The third surface 523 is a surface which crosses the second surface 522, and is different from the first surface 521. In other words, the third surface 523 is a surface at the opposite side to the first surface 521, and faces to the −X direction.

It should be noted that the wavelength conversion layer 52 is formed to have substantially circular shape viewed from the first surface 521 side. However, this is not a limitation, and the wavelength conversion layer 52 can be formed to have a substantially rectangular shape viewed from the first surface 521 side.

Configuration of Low-Refractive Index Layer

The low-refractive index layer 53 is disposed at the −X direction side of the wavelength conversion layer 52, and has contact with the third surface 523. The low-refractive index layer 53 is a layer having a lower refractive index than the refractive index of glass included as a principal component in the optical element 58 described later. In other words, the low-refractive index layer 53 is formed of a material having a lower refract eve index than the refractive index of glass included in the optical element 58.

Since the low-refractive index layer 53 is disposed so as to have contact with the third surface 523 of the wavelength conversion layer 52, it is possible to reduce the critical angle of the light entering the third surface 523 from the inside of the wavelength conversion layer 52. Thus, it is possible to decrease an amount of the fluorescence YL passing through the third surface 523 in the −X direction.

In the present embodiment, the low-refractive index layer 53 is a film having $SiO_2$ as a principal component, namely an $SiO_2$ film. However, this is not a limitation, and the low-refractive index layer 53 can be formed of other materials. For example, the low-refractive index layer 53 can be a porous film having $SiO_2$ as a principal component, or a porous film having $CaF_2$ as a principal component. The porous film can be formed by diffusing silica particles having sizes in a range of, for example, several nm through several tens of nm in an organic solution, then applying the organic solution, and then calcining the organic solution to evaporate the organic solution.

Configuration of Reflecting Layer

The reflecting layer 54 is disposed at an opposite side to the wavelength conversion layer 52 with respect to the low-refractive index layer 53. In other words, the reflecting layer 54 is disposed between the low-refractive index layer 53 and the support body 56. The reflecting layer 54 reflects the light entering the reflecting layer 54 from the low-refractive index layer 53 side.

When the low-refractive index layer 53 is an $SiO_2$ film, it is possible to form the reflecting layer 54 as a reflecting film formed of metal such as silver. In this case, the reflecting layer 54 is a metal film.

In contrast, when the low-refractive index layer 53 is the porous film having $SiO_2$ as the principal component, or when the low-refractive index layer 53 is the porous film having $CaF_2$ as the principal component, it is possible to decrease the refractive index of the low-refractive index layer 53 to no higher than 1.3. In this case, the reflecting layer 54 can be formed of a dielectric multilayer film instead of the metal reflecting film.

Configuration of Jointing Layer

The jointing layer 55 bonds the optical layer 51 and the support body 56 to each other. For example, the jointing layer 55 can be a solder layer. However, when the jointing layer 55 is the solder layer, it is cumbersome to bond the optical layer 51 and the support body 56 to each other. In the present embodiment, as the jointing layer 55, it is possible to adopt a layer formed by performing solid joint on an Si film provided to a surface at the −X direction side of the reflecting layer 54 and an Si film provided to a surface at the +X direction side of the support body 56. In this case, since the jointing layer 55 plays the role as that of the low-refractive index layer 53, it is possible to use the dielectric multilayer film as the reflecting layer 54 to eliminate the low-refractive index layer 53 between the wavelength conversion layer 52 and the reflecting layer 54.

When adopting this configuration, it results in that the solid joint of the optical layer 51 and the support body 56 is performed, and thus, the joint of the optical layer 51 and the support body 56 can easily be performed, and in addition, it is possible to firmly bond the optical layer 51 and the support body 56 to each other.

It is also possible to bake the support body 56 and the reflecting layer 54 to each other with nano-silica described above instead of the jointing layer 55. Also in this case, the low-refractive index layer 53 becomes unnecessary, the function of the low-refractive index layer 53 is substituted by the nano-silica layer, and it is sufficient to use a dielectric multilayer film as the reflecting layer 54.

Configuration of Support Body

The support body 56 is bonded to the reflecting layer 54 with the jointing layer 55 to support the optical layer 51. In other words, the support body 56 is disposed at an opposite side of the jointing layer 55 to the wavelength conversion layer 52, the low-refractive index layer 53, and the reflecting layer 54 to support the wavelength conversion layer 52, the low-refractive layer 53, and the reflecting layer 54. Besides the above, the support body 56 functions as a heat spreader, and diffuses the heat of the wavelength conversion layer 52 transmitted from the optical layer 51 via the jointing layer 55. The heat which is transferred from the optical layer 51 is transferred by the support body 56 to the radiation member 57 coupled to the support body 56.

The support body 56 is, for example, a sintered body. In the present embodiment, in order to decrease a difference in linear expansion coefficient between the support body 56 and the wavelength conversion layer 52, the support body 56 is formed of a sintered body made of molybdenum-copper. However, this is not a limitation, and the material of the support body 56 does not matter. For example, the support body 56 can be a sintered body made of molybdenum-diamond, a sintered body made of molybdenum-silver, or a sintered body made of molybdenum-copper, or can also be formed of metal good in thermal conductivity.

The difference in linear expansion coefficient between the support body 56 and the wavelength conversion layer 52 is desirably no larger than $2.0 \times 10^{-6}$. The reason is that since the calcination of the jointing layer 55 is performed at temperature as high as several hundreds of degrees, there is a possibility that the jointing layer 55 is destroyed due to a stress caused by the difference in linear expansion coefficient when restoring to the room temperature. More preferably, the difference is desirably no larger than $1.0 \times 10^{-6}$.

Configuration of Radiation Member

The radiation member 57 is disposed on a surface at an opposite side to the optical layer 51 in the support body 56. The radiation member 57 is a heatsink, and releases the heat transferred from the support body 56. The radiation member 57 has a plurality of fins 571 extending toward an opposite side to the support body 56.

A cooling gas circulates between the fins 571 due to a fan constituting the cooling device. The plurality of fins 571 transfers the heat of the optical layer 51 which is transferred to the radiation member 57 to the cooling gas circulating between the fins 571 to thereby cool the optical layer 51, in particular, the wavelength conversion layer 52.

Configuration of Optical Element

The optical element 58 is a parabolic reflector, and collects the fluorescence YL emitted from the wavelength conversion layer 52, and then uniforms and emits the result toward the +X direction from an exit surface 58A at the +X direction side. The optical element 58 is disposed at the +X direction side of the optical layer 51. In other words, the optical element 58 is disposed at the exit side of the fluorescence YL by the wavelength conversion layer 52 with respect to the optical layer 51. In more detail, the optical element 58 is provided to the wavelength conversion layer 52 so as to cover the wavelength conversion layer 52 at the +X direction side, and at the outer side in a radial direction centering on an axis along the +X direction.

The optical element 58 has a recessed part 581 recessed toward the +X direction in an end part at the −X direction side. The wavelength conversion layer 52 is disposed inside the recessed part 581 so that the first surface 521 has contact with a bottom surface of the recessed part 581, and the second surface 522 has contact with an inner side surface of the recessed part 581. In other words, the optical element 58 is attached to the wavelength conversion layer 52 so as to make contact with the first surface 521 and the second surface 522. The optical element 58 has a shape which spreads outward from the second surface 522 as getting away from the wavelength conversion layer 52 toward the +X direction.

A side surface 58B of the optical element 58 is formed to have a shape of totally reflecting the fluorescence YL emitted from the second surface 522 toward the optical element 58. However, this is not a limitation, and it is possible to form a reflecting layer on an outer surface in the side surface of the optical element 58.

The optical element 58 is formed of a material having glass such as borosilicate glass as a principal component, and is filled with glass. In other words, the optical element 58 is a solid parabolic reflector having glass as the principal component.

The refractive index of glass included in the optical element 58 is lower than the refractive index of the wavelength conversion layer 52. Further, the difference in linear expansion coefficient between glass included in the optical element 58 and the wavelength conversion layer 52 is no larger than $3.0 \times 10^{-6}$. Thus, even when a compressive load is applied to the wavelength conversion layer 52 when manufacturing the wavelength conversion element 5 using a manufacturing method described later, it is possible to reduce the stress applied to the wavelength conversion layer 52 to a stress no higher than the flexural strength, and thus, it is possible to prevent damage of the wavelength conversion layer 52.

Function of Wavelength Conversion Element

The fluorescence YL Generated in the wavelength conversion layer 52 is radially diffused. Therefore, out of the fluorescence YL generated in the wavelength conversion layer 52, a part of the fluorescence YL is emitted from the first surface 521 to the outside of the wavelength conversion layer 52, another part of the fluorescence YL is emitted from the second surface 522 to the outside of the wavelength conversion layer 52, and still another part of the fluorescence YL is emitted from the third surface 523 to the outside of the wavelength conversion layer 52. The fluorescence YL emitted from the third surface 523 to the outside of the wavelength conversion layer 52 enters the reflecting layer 54 via the low-refractive index layer 53, and is then reflected by the reflecting layer 54 toward the wavelength conversion layer 52, and therefore enters the wavelength conversion layer 52 once again via the low-refractive index layer 53.

Here, the content rate of the scattering element such as the air holes in the wavelength conversion layer 52 is no higher than 5% in volume ratio of the wavelength conversion layer, desirably no higher than 0.1%, and more desirably 0%, which is a relatively low value. Therefore, in the wavelength conversion layer 52, the scattering of the fluorescence YL due to the scattering element is difficult to occur.

In contrast, since the fluorescence YL generated in the wavelength conversion layer 52 is difficult to be scattered by the air holes, it is possible to prevent the fluorescence YL from reciprocating between the wavelength conversion layer 52 and the reflecting layer 54, and thus, it is possible to make it easy for the fluorescence YL to be emitted to the outside of the wavelength conversion layer 52. Thus, it is possible to prevent the absorption of the fluorescence YL in the reflecting layer 54 from frequently occurring, and thus, it is possible to increase the extraction efficiency of the fluorescence YL from the optical layer 51.

Further, the refractive index of borosilicate glass as the principal component of the optical element 58 is 1.5, and the refractive index of the wavelength conversion layer 52 is 1.8. Therefore, out of the fluorescence YL generated inside the wavelength conversion layer 52, the fluorescence YL which enters the first surface 521 as an interface between the wavelength conversion layer 52 and the optical element 58 at an incident angle no smaller than about 56° is totally reflected by the first surface 521, then propagates through the wavelength conversion layer 52, and is then emitted from the second surface 522.

Here, at the −X direction side of the wavelength conversion layer 52, there is disposed the low-refractive index layer 53 having contact with the third surface 523. The refractive index of the low-refractive index layer 53 is lower than the refractive index of glass as the principal component of the optical element 58. Therefore, when the fluorescence YL which propagates through the wavelength conversion layer 52 toward the second surface 522 enters the third surface 523, the fluorescence YL is totally reflected by the third surface 523, and therefore propagates through the wavelength conversion layer 52 toward the second surface 522 without loss.

In contrast, the fluorescence YL which enters the third surface 523 from the inside of the wavelength conversion layer 52 at an incident angle smaller than about 56° passes through the third surface 523, and by extension, passes through the low-refractive index layer 53.

In contrast, as described above, at an opposite side to the wavelength conversion layer 52 with respect to the low-refractive index layer 53, there is disposed the reflecting layer 54 formed of a metal film such as silver, or the dielectric multilayer film. Thus, the fluorescence YL having passed through the low-refractive index layer 53 in the −X direction can be reflected by the reflecting layer 54 toward the +X direction. As described above, since the content rate of the scattering element in the wavelength conversion layer 52 is low, the fluorescence YL having reentered the wavelength conversion layer 52 is emitted from the first surface 521 to the optical element 58, and is emitted toward the +X direction from the exit surface 58A at the opposite side to the wavelength conversion layer 52 in the optical element 58 to the outside of the wavelength conversion element 5.

It should be noted that the fluorescence YL emitted from the second surface 522 to the optical element 58 is totally reflected by the side surface 58B of the optical element 58, and is then emitted toward the +X direction from the exit surface 58A.

As described above, the fluorescence YL generated inside the wavelength conversion layer 52 directly enter the optical element 58 from the first surface 521, or propagates through the wavelength conversion layer 52 to be emitted from the second surface 522 to the optical element 58, or is emitted from the third surface 523 to be reflected once by the reflecting layer 54, and then enters the wavelength conversion layer 52 to enter the optical element from the first surface 521. Therefore, most of the fluorescence YL generated inside the wavelength conversion layer 52 is not retained inside the wavelength conversion layer 52. Thus, since the light density in the wavelength conversion layer 52 is prevented from increasing, the reabsorption of the light by the phosphor material is prevented, and thus, it is possible to increase the use efficiency of the blue light beam its as the excitation light, and the extraction efficiency of the fluorescence from the optical layer 51.

Method of Manufacturing Wavelength Conversion Element

The wavelength conversion element 5 is manufactured using, for example, the following manufacturing method.

A glass material is heated to a temperature equal to or higher than the softening point, and is then pressed into a shape in a mold to thereby form the optical element 58. The glass material has, for example $SiO_2$, boric acid, and alkali as principal components, the softening point is 700° C., and the linear expansion coefficient is $5\times10^{-6}$.

When pressing the optical element 58 into the shape, the wavelength conversion layer 52 is arranged in advance on an end surface at the opposite side to the exit surface 58A in the optical element 58. Thus, the first surface 521 and the second surface 522 of the wavelength conversion layer 52 have contact with the optical element 58, and the wavelength conversion layer 52 is covered with the glass material.

Subsequently, the glass material adheres to the wavelength conversion layer 52 at about 600° C. between the softening point and a deformation point, and is then cooled down to the room temperature.

Since the linear expansion coefficient of borosilicate glass forming the optical element 58 is relatively high, the compressive load is applied to the wavelength conversion layer 52 as the temperature drops. The wavelength conversion layer 52 is made of ceramics, and is therefore robust over the compressive load, but is weak in tensile load.

In contrast, since the difference in linear expansion coefficient between borosilicate glass and the wavelength conversion layer 52 is $3.0\times10^{-6}$, when the temperature difference from the softening point of borosilicate glass to the room temperature is 600° C., a distortion of $1.8\times10^{-3}$ occurs. In contrast, since the elastic modulus of borosilicate glass is 300 GPa, a compressive force of about 500 MPa is applied to the wavelength conversion layer 52. However, since the compressive strength of the wavelength conversion layer 52 is about 1000 MPa, the wavelength conversion layer 52 adheres to borosilicate glass without destruction.

It should be noted that the optical element 58 can be manufactured using injection molding.

Advantages of First Embodiment

The projector 1 according to the present embodiment described hereinabove exerts the following advantages.

The projector 1 is provided with the light source device 4, the light modulation devices 343 for modulating the light emitted from the light source device 4 in accordance with the image information, and the projection optical device 36 for projecting the light modulated by the light modulation devices 343. The light source device 4 is provided with the wavelength conversion element 5 and the light source 401 for emitting the blue light beam Ls to be made to enter the wavelength conversion element 5.

The wavelength conversion element 5 is provided with the wavelength conversion layer 52, the low-refractive index layer 53, and the optical element 58. The wavelength conversion layer 52 converts the blue light beam Ls into the fluorescence YL in the wavelength band different from the wavelength band of the blue light beam Ls. The blue light beam Ls corresponds to the first light in the first wavelength band. The fluorescence YL corresponds to the second light in the second wavelength band different from the first wavelength band. The wavelength conversion layer 52 includes scattering element no higher than 5% in volume ratio. The wavelength conversion layer 52 has the first surface 521, the second surface 522 crossing the first surface 521, and the third surface 523 crossing the second surface 522, and different from the first surface 521. The optical element 58 includes glass lower in refractive index than the wavelength conversion layer 52. The optical element 58 has contact with the first surface 521 and the second surface 522. The low-refractive index layer 53 is lower in refractive index than glass of the optical element 58. The low-refractive index layer 53 has contact with the third surface 523.

According to such a configuration, since the optical element 58 including glass having the refractive index lower than the refractive index of the wavelength conversion layer 52 has contact with the first surface 521 and the second surface 522, the generation of internal reflection on the first surface 521 and the second surface 522 can be prevented. Thus, it is possible to make it easy to emit the light from the first surface 521 and the second surface 522 to the outside of the wavelength conversion layer 52.

Further, the third surface 523 is provided with the low-refractive index layer 53 having the refractive index lower than the refractive index of glass included in the optical element 58. Therefore, it is possible to make it easy to perform the internal reflection by the third surface 523 on the light on which the internal reflection has been performed by the first surface 521 and the second surface 522, and which enters the third surface 523. Thus, it is possible to make it easy to propagate the light through the wavelength conversion layer 52 to be emitted from the first surface 521 or the second surface 522 to the outside of the wavelength conversion layer 52.

Further, since the content rate of the scattering element such as air holes in the wavelength conversion layer 52 is no higher than 5% in the volume ratio, it is possible to prevent the light from scattering in the wavelength conversion layer 52. Thus, it is possible to prevent the light density in the wavelength conversion layer 52 from increasing, and thus, it is possible to prevent the reabsorption of the light by the phosphor material.

According to the above, since it is possible to efficiently convert the blue light beam Ls into the fluorescence YL to emit the fluorescence YL to the outside of the wavelength conversion layer 52, it is possible to increase the use efficiency of the blue light beam Ls, and it is possible to increase the extraction efficiency of the fluorescence YL. Therefore, it is possible to increase the amount of light emitted from the wavelength conversion layer 52, and by extension, it is possible to increase the amount of light emitted from the wavelength conversion element 5.

The projector 1 is provided with the light source device 4 having the wavelength conversion element 5, and thus, it is possible to achieve an increase in luminance of the image to be displayed on the projection target surface.

In the wavelength conversion element 5, the low-refractive index layer 53 is an $SiO_2$ film having $SiO_2$ as a principal component.

According to such a configuration, it is possible to configure the low-refractive index layer 53 having the refractive index lower than the refractive index of glass included in the optical element 58.

It should be noted that the low-refractive index layer 53 can be a porous film having $SiO_2$ as a principal component, or can also be a porous film having $CaF_2$ as a principal component. According also to such a configuration, it is possible to configure the low-refractive index layer 53 having the refractive index lower than the refractive index of glass included in the optical element 58.

The wavelength conversion element 5 is disposed at the opposite side to the wavelength conversion layer 52 with respect to the low-refractive index layer 53, and is provided with the support body 56 for supporting the wavelength conversion layer 52 and the low-refractive index layer 53.

According to such a configuration, it is possible to transfer the heat generated in the wavelength conversion layer 52 to the support body 56, and it is possible to diffuse the heat in the support body 56. Therefore, since it is possible to prevent the wavelength conversion layer 52 from rising in temperature, it is possible to prevent the conversion efficiency into the fluorescence YL in the wavelength conversion layer 52 from decreasing.

The wavelength conversion element 5 is provided with the optical layer 51 and the jointing layer 55. The optical layer 51 includes the wavelength conversion layer 52 and the low-refractive index layer 53. The jointing layer 55 includes Si, and bonds the optical layer 51 and the support body 56 to each other.

According to such a configuration, it is possible to bond the optical layer 51 and the support body 56 to each other by solid joint without using solder. Therefore, it is possible to simplify the joint step of the optical layer 51 and the support body 56.

The wavelength conversion element 5 is provided with the reflecting layer 54 which is disposed at the opposite side to the wavelength conversion layer 52 with respect to the low-refractive index layer 53, and reflects the light entering the reflecting layer 54 from the low-refractive index layer 53 side.

According to such a configuration, the light which passes through the third surface 523 and is emitted from the wavelength conversion layer 52 toward the low-refractive index layer 53 can be reflected by the reflecting layer 54 toward the wavelength conversion layer 52. According to the above, it is possible to return the light passing through the third surface 523 to the wavelength conversion layer 52.

Here, as described above, the content rate of the scattering element such as the air holes in the wavelength conversion layer 52 is relatively low. According to the above, it is possible to prevent the reciprocation of the light between the scattering element and the reflecting layer 54 from frequently occurring to frequently cause the absorption of the light in the reflecting layer 54. In other words, the loss of the light can be prevented.

Therefore, since it is possible to increase the amount of light emitted from the first surface 521 and the second surface 522 of the wavelength conversion layer 52, it is possible to increase the amount of light emitted from the wavelength conversion layer 52, and by extension, the amount of light emitted from the wavelength conversion element 5.

In the wavelength conversion element 5, the reflecting layer 54 is a metal film.

According to such a configuration, the reflecting layer 54 deterioration of which is suppressed can be formed with relative ease.

In the wavelength conversion element 5, the optical element 58 is the reflector which has a parabolic shape, and collects the fluorescence YL emitted from the wavelength conversion layer 52. The reflector is filled with glass constituting the optical element 58. For example, when the principal component of the optical element 58 is borosilicate glass, the optical element 58 is the parabolic reflector filled with borosilicate glass.

According to such a configuration, the light emitted from the first surface 521 and the second surface 522 can be uniformed and emitted toward the +X direction by the optical element 58. Further, since the optical element 58 as the reflector is filled with glass, the optical element 58 having contact with the first surface 521 and the second surface 522 can be configured as an integral molding component, and in addition, is possible to configure the optical element 58 so that the internal reflection is performed by the side surface of the optical element 58 on the light emitted from the first surface 521 and the second surface 522. Therefore, it is possible to enhance the usability of the wavelength conversion element 5.

In the wavelength conversion element 5, the difference in linear expansion coefficient between glass included in the optical element 58 and the wavelength conversion layer 52 is no larger than $3.0 \times 10^{-6}$ in the temperature range from the softening point of glass included in the optical element 58 to the room temperature.

Here, when forming the optical element 58, the compressive load is applied to the wavelength conversion layer 52 embedded in the optical element 58 as the temperature of the optical element 58 drops.

In contrast, since the difference in linear expansion coefficient between glass included in the optical element 58 and the wavelength conversion layer 52 is no larger than the numerical value described above in the temperature range from the softening point to the room temperature, it is possible to make the compressive load applied to the wavelength conversion layer 52 smaller than the compressive strength of the wavelength conversion layer 52. Therefore, it is possible to make the wavelength conversion layer 52 and the optical element 58 adhere to each other without damaging the wavelength conversion layer 52.

Second Embodiment

Then, a second embodiment of the present disclosure will be described.

The projector according to the present embodiment is provided with substantially the same configuration as that of the projector according to the first embodiment, but is different therefrom in the configuration of the light source device and the configuration of the wavelength conversion element. In more detail, the light source device 4 in the projector 1 is provided with the reflective wavelength conversion element 5 on the one hand, the light source device in the projector according to the present embodiment provided with a transmissive wavelength conversion element on the other hand. It should be noted that in the following description, a part which is the same or substantially the same as the part having already been described is denoted by the same reference symbol, and the description thereof will be omitted.

Figure 4:
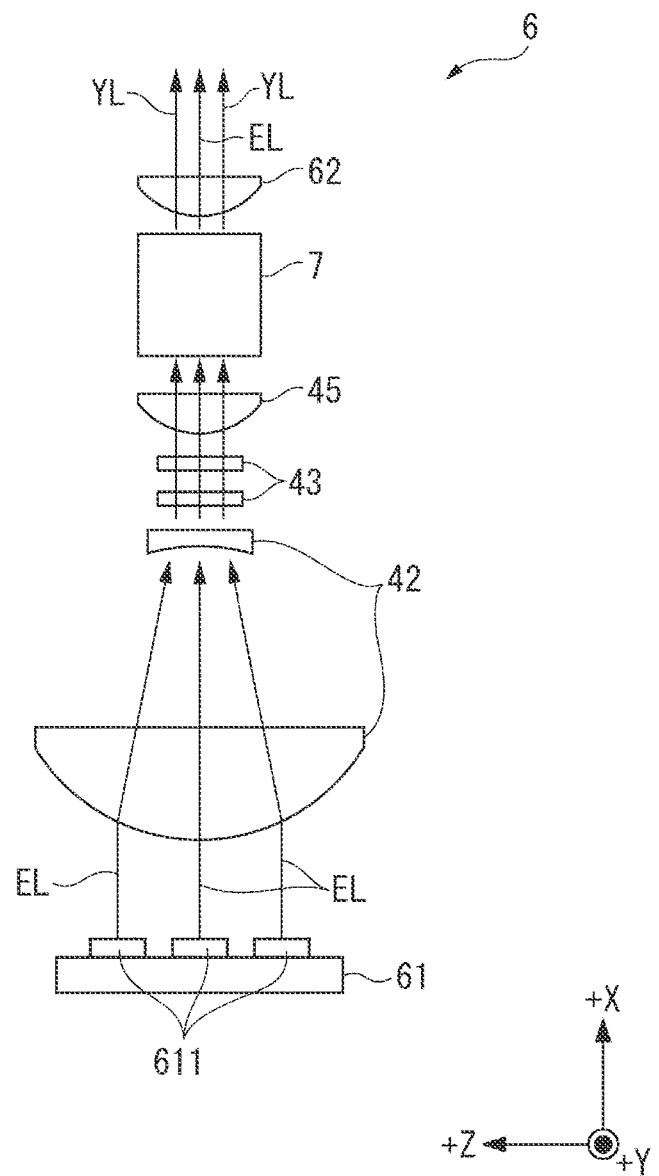
FIG. 4 is a schematic diagram showing a configuration of a light source device according to a second embodiment.

FIG. 4 is a schematic diagram showing configuration of the light source device 6 provided to the projector according to the present embodiment.

The projector according to the present embodiment has substantially the same configuration and functions as those of the projector 1 except the point that the projector according to the present embodiment is provided with a light source device 6 shown in FIG. 4 instead of the light source device 4.

Similarly to the light source device 4, the light source device 6 emits the illumination light having a white color to the homogenizing device 31. The light source device 6 has a light source 61, the afocal optical element 41, the homogenizer optical element 43, the first light collection element 45, a wavelength conversion element 7, and a second light collection element 62.

The light source 61 has a plurality of solid-state light emitting elements 611 for emitting blue light beams EL as the excitation light. It should be noted that the solid-state light emitting elements 611 each emit the blue light beam including the s-polarized light and the p-polarized light mixed with each other, but can emit the blue light beam as the s-polarized light, which is the same as the solid-state light emitting elements 402. In the present embodiment, the blue light beam EL corresponds to the first light in the first wavelength band, and the fluorescence YL corresponds to the second light in the second wavelength band different from the first wavelength band.

The afocal optical element 41 reduces the diameter of each of the blue light beams EL emitted from the light source 61.

The homogenizer optical element 43 homogenizes the illuminance distribution of the blue light beam EL thus reduced in diameter.

The first light collection element 45 collects the blue light beams EL which enter the first light collection element 45.

The wavelength conversion element 7 converts the wavelength of the blue light beams EL to emit the fluorescence YL.

The second light collection element 62 collects and collimates the blue light beams EL and the fluorescence YL emitted from the wavelength conversion element 7.

Configuration of Wavelength Conversion Element

Figure 5:
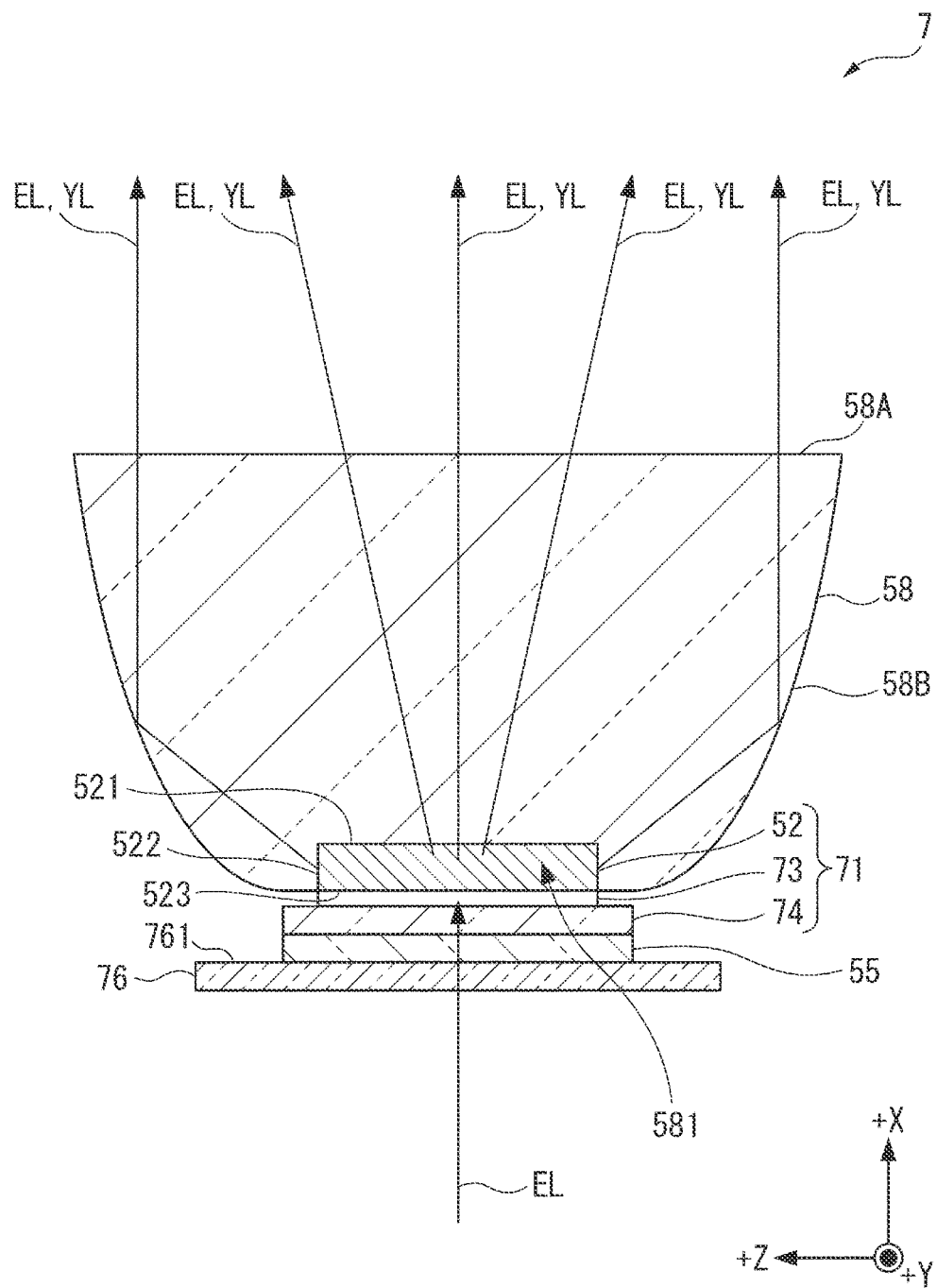
FIG. 5 is a schematic diagram showing a configuration of a wavelength conversion element according to the second embodiment.

FIG. 5 is a diagram schematically showing a cross-sectional surface of the wavelength conversion element 7.

The wavelength conversion element 7 converts the wavelength of a part of the first light entering the wavelength conversion element 7 and then emits the second light in the wavelength band different from the wavelength band of the first light along an incident direction of the first light with respect to the wavelength conversion element 7. In more detail, the wavelength conversion element 7 is a transmissive wavelength conversion element which converts a part of the blue light beams EL out of the blue light beams EL entering the wavelength conversion element 7 into the fluorescence YL, and then emits the blue light beams EL and the fluorescence YL along the incident direction of the blue light beams EL.

As shown in FIG. 5, the wavelength conversion element 7 is provided with an optical layer 71, the jointing layer 55, a support body 76, and the optical element 58.

Similarly to the optical layer 51, the optical layer 71 is provided with the wavelength conversion layer 52, a low-refractive index layer 73, and a reflecting layer 74, and is supported by the support body 76 bonded to the optical layer 71 with the jointing layer 55. In the wavelength conversion element 7, the reflecting layer 74, the low-refractive index layer 73, and the wavelength conversion layer 52 are arranged in this order from the −X direction side as the incident side of the blue light beams EL. The wavelength conversion layer 52 is disposed so that the third surface 523 is arranged at the incident side of the blue light beams EL, and the first surface 521 is arranged at an opposite side to the third surface 523. In other words, in the wavelength conversion layer 52, the first surface 521 is arranged at the +X direction side, and the third surface 523 is arranged at the −X direction side.

Similarly to the low-refractive index layer 53, the low-refractive index layer 73 has contact with the third surface 523. The low-refractive index layer 73 is a porous film having $CaF_2$ as a principal component in the present embodiment, but can be a porous film having $SiO_2$ as a principal component.

The reflecting layer 74 is a porous film formed of a dielectric multilayer film having the refractive index no higher than 1.3. The dielectric multilayer film can be formed by stacking $SiO_2$ films and $Al_2O_3$ films as much as no smaller than 40 and no larger than 60.

Here, out of the fluorescence YL generated in the wavelength conversion layer 52, a part of the fluorescence YL is emitted from the first surface 521 to the optical element 58 disposed at the +X direction side of the wavelength conversion layer 52, another part of the fluorescence YL propagates through the wavelength conversion layer 52 and is emitted from the second surface 522 to the optical element 58, and the rest of the fluorescence YL is emitted from the third surface 523 toward the low-refractive index layer 73. When the refractive index of the reflecting layer 74 is 1.3, since the critical angle at the third surface 523 as an interface between the wavelength conversion layer 52 and the low-refractive index layer 73 is 45°, the fluorescence YL as the p-polarization component entering the third surface 523 with the incident angle to the third surface 523 no smaller than 40° and no larger than 45° out of the fluorescence YL generated in the wavelength conversion layer 52 passes through the third surface 523 and the low-refractive index layer 73 toward the incident side of the blue light beams EL, and further passes through the reflecting layer 74 toward the incident side of the blue light beams EL. Assuming that the spread of the fluorescence generated in the wavelength conversion layer 52 is the same as that of the Lambertian emission, the fluorescence YL as the p-polarization component passing through the reflecting layer 74 is calculated to be about 3% of all of the fluorescence YL generated in the wavelength conversion layer 52. In other words, about 3% of the fluorescence YL generated in the wavelength conversion layer 52 is lost.

In contrast, by using a part of a sphere protruding toward an opposite side to the low-refractive index layer 73, or a part of a conical surface protruding toward the opposite side to the low-refractive index layer as the reflecting layer 74, and further forming a reflecting film made of aluminum or the like on an outer surface except the passing region of the blue light beams EL, it is possible to return a part of the fluorescence YL passing through the reflecting layer 74 to the low-refractive index layer 73, and by extension, to the wavelength conversion layer 52, and thus, it is possible to reduce an amount of loss of the fluorescence YL.

The support body 76 is bonded to the reflecting layer 74 with the jointing layer 55 as an Si film. When the jointing layer 55 is the Si film having the thickness no smaller than 500 nm, substantially the same function as that of the low-refractive index layer 73 is exerted, and it is possible to increase the total reflection ratio to the fluorescence YL generated in the wavelength conversion layer 52. In that case, the low-refractive index layer 73 can be eliminated. The support body 76 is formed of sapphire having a light transmissive property.

The linear expansion coefficient of sapphire and the linear expansion coefficient of the wavelength conversion layer 52 are substantially equal to each other. This means that the stress applied to the wavelength conversion layer 52 is low even when the wavelength conversion layer 52 generates heat due to the incidence of the blue light beams EL. Therefore, the optical layer 71 is prevented from being separated from the support body 76.

It should be noted that although not shown in the drawings, a surface 761 opposed to the jointing layer 55 in the support body 76 is provided with an asperity for diffusing the blue light beams EL passing through the support body 76 toward the jointing layer 55.

Function of Wavelength Conversion Element

The blue light beams EL enter the wavelength conversion element 7 along the +X direction toward the optical element 58 from the support body 76. The blue light beams EL pass through the support body 76, the jointing layer 55, the reflecting layer 74, and the low-refractive index layer 73 to enter the wavelength conversion layer 52.

A part of the blue light beams EL having entered the wavelength conversion layer 52 passes through the wavelength conversion layer 52, and is then emitted from the first surface 521 or the second surface 522 to the optical element 58.

The rest of the blue light beams EL having entered the wavelength conversion layer 52 are converted into the fluorescence YL by the phosphor material included in the wavelength conversion layer 52.

A part of the fluorescence YL thus converted is emitted from the first surface 521 to the optical element 58, and another part of the fluorescence YL propagates through the wavelength conversion layer 52, and is then emitted from the second surface 522 to the optical element 58. Further, still another part of the fluorescence it is internally reflected by the first surface 521, the second surface 522, or the third surface 523, and is then emitted from the first surface 521 or the second surface 522 to the optical element 58. Further, another part of the fluorescence YL passes through the third surface 523 and the low-refractive index layer 73 to enter the reflecting layer 74. The fluorescence YL having entered the reflecting layer 74 is reflected by the reflecting layer 74, and then enters the wavelength conversion layer 52 via the low-refractive index layer 73. The fluorescence having entered the wavelength conversion layer 52 is emitted from the first surface 521 or the second surface 522 to the optical element 58.

The blue light beams EL and the fluorescence YL having entered the optical element 58 are collected by the optical element 58, then enter the second light collection element 62 to be collimated by the second light collection element 62, and then enter the homogenizing device 31 (see FIG. 1).

Advantages of Second Embodiment

The projector related to the present embodiment described hereinabove exerts the following advantages is addition to the advantages substantially the same as those of the projector 1 according to the first embodiment.

In the wavelength conversion element 7, the reflecting layer 74 is a dielectric multilayer film.

According to such a configuration, it is possible to configure the reflecting layer 74 which transmits the blue light beams EL and reflects the fluorescence YL. Therefore, it is possible to configure the wavelength conversion element 7 as the transmissive wavelength conversion element.

Modifications of Embodiments

The present disclosure is not limited to each of the embodiments described above, but includes modifications, improvements, and so on in the range in which the advantages of the present disclosure can be achieved.

In each of the embodiments described above, it is assumed that the first light in the first wavelength band is the blue light beam as the laser beam having the peak wavelength of 440 nm. However, this is not a limitation, and the wavelength of the first light in the first wavelength band is not limited to the above, but can be light in another wavelength band. Further, it is assumed that the second light in the second wavelength band is the fluorescence YL as the light having the peak wavelength in the range of 500 through 700 nm. However, this is not a limitation, and the wavelength band of the second light can differ by the phosphor material included in the wavelength conversion layer 52.

In each of the embodiments described above, it is assumed that the optical element 58 includes borosilicate glass as the principal component. However, this is not a limitation, and glass included in the optical element 58 as the principal component can be other glass. Further, the optical element 58 can include two or more types of glass.

In each of the embodiments described above, it is assumed that the low-refractive index layers 53, 73 are each a film having $SiO_2$ as a principal component, a porous film having $SiO_2$ as a principal component, or a porous film having $CaF_2$ as a principal component. However, this is not a limitation, and the low-refractive index layer can be formed of other materials providing the low-refractive index layer is formed of a material having a lower refractive index than the refractive index of glass as the principal component of the optical element 58.

In the first embodiment described above, it is assumed that there is provided the support body 56 for supporting the wavelength conversion layer 52 and the low-refractive index layer 53. In the second embodiment described above, it is assumed that there is provided the support body 76 for supporting the wavelength conversion layer 52 and the low-refractive index layer 73. However, the support bodies 56, 76 can be eliminated. In this case, the jointing layer 55 can be omitted.

In the first embodiment described above, it is assumed that the wavelength conversion element 5 is provided with the jointing layer 55 for jointing the optical layer 51 and the support body 56 to each other. In the second embodiment described above, it is assumed that the wavelength conversion element 7 is provided with the jointing layer 55 for jointing the optical layer 71 and the support body 76 to each other. It is assumed that the jointing layer 55 includes Si. In other words, it is assumed that the jointing layer 55 is a layer in which the solid joint is performed on the Si film provided to the optical layer 51, 71 and the Si film provided to the support body 56, 76. However, this is not a limitation, and the jointing layer 55 is not necessarily required to include Si. For example, the jointing layer 55 can be a layer formed of a jointing material such as solder, or an adhesive.

In the first embodiment described above, it is assumed that the wavelength conversion element 5 is provided with the reflecting layer 54 which is disposed between the low-refractive index layer 53 and the support body 56, and reflects the light entering the reflecting layer 54 from the low-refractive index layer 53 side. In the second embodiment described above, it is assumed that the wavelength conversion element 7 is provided with the reflecting layer 74 which is disposed between the low-refractive index layer 73 and the support body 76, and reflects the light entering the reflecting layer 74 from the low-refractive index layer 73 side. However, this is not a limitation, and the reflecting layers 54, 74 can be eliminated. Further, it possible to adopt a configuration in which the jointing layer 55 disposed between the reflecting layer 54, 74 and the support body 56, 76 also functions as the low-refractive index layer 53, 73, and the low-refractive index layer 53, 73 is located at the position of the jointing layer 55.

Further, it is assumed that the reflecting layer 54 is the metal film formed of silver or the like, and the reflecting layer 74 is the dielectric multilayer film. However, this is not a limitation, and the materials of the reflecting layers 54, 74 are not limited to the above.

In each of the embodiments described above, it is assumed that the optical element 58 is the parabolic reflector which has the parabolic shape, and collects the fluorescence YL emitted from the wavelength conversion layer 52. However, this is not a limitation, and the optical element 58 can be a layer for covering the first surface 521 and the second surface 522 of the wavelength conversion layer 52. In other words, the optical element can be another low-refractive index layer different from the low-refractive index layers 53, 73. Further, the optical element 58 can be a reflector having other shapes than the parabolic shape such as an adjustable surface reflector. In other words, the shape of the optical element is not limited to the above.

In each of the embodiments described above, it is assumed that the reflector as the optical element 58 is filled with glass as the principal component of the optical element 58. In other words, it is assumed that the optical element 58 is the solid reflector having glass as the principal component. However, this is not a limitation, and it sufficient for a part of the optical element 58 to have contact with the first surface 521 and the second surface 522, and the optical element 58 can be a hollow reflector.

In each of the embodiments described above, it is assumed that the difference in linear expansion coefficient between glass included in the optical element 58 as the principal component and the wavelength conversion layer 52 is no larger than $3.0 \times 10^{-6}$ in the temperature range from the softening point of glass as the principal component to the room temperature. However, this is not a limitation, and the difference in linear expansion coefficient therebetween is not necessarily required to be no larger than $3.0 \times 10^{-6}$. For example, the difference in linear expansion coefficient therebetween can slightly exceed $3.0 \times 10^{-6}$.

In each of the embodiments described above, it is assumed that the projector is equipped with the three light modulation devices 343 (343R, 343G, and 343B). However, this is not a limitation, and the present disclosure can also be applied to a projector equipped with two or less, or four or more light modulation devices.

In each of the embodiments described above, the description is presented assuming that the image projection device 3 is provided with the configuration and the layout shown in FIG. 1. However, this is not a limitation, and the configuration and the layout of the image projection device 3 are not limited to the above. The same applies to the light source device 4 shown in FIG. 2 and the light source device 6 shown in FIG. 4.

In each of the embodiments described above, it is assumed that the light modulation devices 343 are each provided with the transmissive liquid crystal panel having the plane of incidence of light and the light exit surface different from each other. However, this is not a limitation, and the light modulation devices 343 can each be a device provided with a reflective liquid crystal panel which has the plane of incidence of light and the light exit surface coinciding with each other. Further, it is also possible to adopt a light modulation device other than the liquid crystal device such as a device using a micromirror such as a digital micromirror device (DMD) providing the light modulation device is capable of modulating the incident light beam to form the image corresponding to the image information.

In each of the embodiments described above, there is cited an example in which the light source device 4, 6 according to the present disclosure is applied to the projector. However, this is not a limitation, and it is also possible for the light source device according to the present disclosure to be adopted in, for example, lighting equipment, and a head light or the like of a vehicle or the like.

In each of the embodiments described above, there is cited an example in which the wavelength conversion element according to the present disclosure is applied to the light source device. However, this is not a limitation, and the wavelength conversion element according to the present disclosure can be adopted in other devices than the light source device.

CONCLUSION OF PRESENT DISCLOSURE

Hereinafter, the conclusion of the present disclosure will additionally be described.

A wavelength conversion element according to a first aspect of the present disclosure includes a wavelength conversion layer which is configured to convert first light in a first wavelength band into second light in a second wavelength band different from the first wavelength band, which includes a scattering element no higher than 5% in volume ratio, and which has a first surface, a second surface crossing the first surface, and a third surface crossing the second surface and different from the first surface, an optical element which includes glass lower in refractive index than the wavelength conversion layer, and has contact with the first surface and the second surface, and a low-refractive index layer which is lower in refractive index than the glass, and has contact with the third surface.

According to such a configuration, since the optical element including glass having the refractive index lower than the refractive index of the wavelength conversion layer has contact with the first surface and the second surface of the wavelength conversion layer, the generation of internal reflection on the first surface and the second surface can be prevented. Thus, it is possible to make it easy to emit the light from the first surface and the second surface to the outside of the wavelength conversion layer.

Similarly, the third surface of the wavelength conversion layer is provided with the low-refractive index layer having the refractive index lower than the refractive index of glass included in the optical element. Therefore, it is possible to make it easy to perform the internal reflection by the third surface on the light on which the internal reflection has been performed by the first surface and the second surface, and which enters the third surface. Thus, it is possible to make it easy to propagate the light through the wavelength conversion layer to be emitted from the first surface or the second surface to the outside of the wavelength conversion layer.

Further, since the content rate of the scattering element in the wavelength conversion layer is no higher than 5% in the volume ratio, it is possible to prevent the light from scattering in the wavelength conversion layer. Thus, it is possible to prevent the light density in the wavelength conversion layer from increasing, and thus, it is possible to prevent the reabsorption of the light by the phosphor material.

According to the above, since it is possible to efficiently convert the first light into the second light to emit the second light to the outside of the wavelength conversion layer, it possible to increase the use efficiency of the first light, and it is possible to increase the extraction efficiency of the second light. Therefore, it is possible to increase the amount of light emitted from the wavelength conversion layer, and by extension, it is possible to increase the amount of light emitted from the wavelength conversion element.

In the first aspect described above, the low-refractive index layer may be a film having $SiO_2$ as a principal component.

According to such a configuration, it is possible to configure the low-refractive index layer having the refractive index lower than the refractive index of glass included in the optical element.

In the first aspect described above, the low-refractive index layer may be a porous film having $SiO_2$ as a principal component.

According to such a configuration, it is possible to configure the low-refractive index layer having the refractive index lower than the refractive index of glass included in the optical element.

In the first aspect described above, the low-refractive index layer may be a porous film having $CaF_2$ as a principal component.

According to such a configuration, it is possible to configure the low-refractive index layer having the refractive index lower than the refractive index of glass included in the optical element.

In the first aspect described above, there may further be included a support body which is disposed at an opposite side to the wavelength conversion layer with respect to the low-refractive index layer, and which is configured to support the wavelength conversion layer and the low-refractive index layer.

According to such a configuration, it is possible to transfer the heat generated in the wavelength conversion layer to the support body, and it is possible to diffuse the heat in the support body. Therefore, since it is possible to prevent the wavelength conversion layer from rising in temperature, it is possible to prevent the conversion efficiency into the second light in the wavelength conversion layer from decreasing.

In the first aspect described above, there may further be included an optical layer including the wavelength conversion layer and the low-refractive index layer, and a jointing layer which includes Si, and is configured to bond the optical layer and the support body to each other.

According to such a configuration, it is possible to bond the optical layer and the support body to each other by solid joint without using solder. Therefore, it is possible to simplify the joint step of the optical layer and the support body.

In the first aspect described above, there may further be included a reflecting layer which is disposed at an opposite side to the wavelength conversion layer with respect to the low-refractive index layer, and which is configured to reflect light entering the reflecting layer from the low-refractive index layer side.

According to such a configuration, the light which passes through the third surface and is emitted from the wavelength conversion layer toward the low-refractive index layer can be reflected by the reflecting layer toward the wavelength conversion layer. According to the above, it is possible to return the light passing through the third surface to the wavelength conversion layer.

Here, as described above, the content rate of the scattering element in the wavelength conversion layer relatively low. According to the above, it is possible to prevent the reciprocation of the light between the scattering element and the reflecting layer from frequently occurring to frequently cause the absorption of the light in the reflecting layer. In other words, the loss of the light can be prevented.

Therefore, since it is possible to increase the amount of light emitted from the first surface and the second surface of the wavelength conversion layer, it is possible to increase the amount of light emitted from the wavelength conversion layer, and by extension, the amount of light emitted from the wavelength conversion element.

In the first aspect described above, the reflecting layer may be a metal film.

According to such a configuration, the reflecting layer deterioration of which is suppressed can be formed with relative ease.

In the first aspect described above, the reflecting layer may be a dielectric multilayer film.

According to such a configuration, since it is possible to configure the reflecting layer for transmitting the first light and reflecting the second light, it is possible to configure the wavelength conversion element according to the first aspect as a transmissive wavelength conversion element.

In the first aspect described above, the optical element may be a reflector which has a parabolic shape, and is configured to collect the second light emitted from the wavelength conversion layer, and the reflector may be filled with the glass.

According to such a configuration, the light emitted from the first surface and the second surface of the wavelength conversion layer can be uniformed and emitted by the optical element. Further, since the optical element as the reflector is filled with glass, the optical element having contact with the first surface and the second surface can be configured as an integral molding component, and in addition, it is possible to configure the optical element so that the internal reflection is performed by the side surface of the optical element on the light emitted from the first surface and the second surface. Therefore, it is possible to enhance the usability of the wavelength conversion element.

In the first aspect described above, a difference in linear expansion coefficient between the glass included in the optical element and the wavelength conversion layer may be no larger than $3.0 \times 10^{-6}$ in a temperature range from a softening point of the glass to a room temperature.

Here, when embedding the wavelength conversion layer in the optical element when forming the optical element, the compressive load is applied to the wavelength conversion layer as the temperature of the optical element drops.

In contrast, since the difference in linear expansion coefficient between glass and the wavelength conversion layer is no larger than the numerical value described above in the temperature range from the softening point of the glass to the room temperature, it is possible to make the compressive load applied to the wavelength conversion layer smaller than the compressive strength of the wavelength conversion layer. Therefore, it is possible to make the wavelength conversion layer and the optical element adhere to each other without damaging the wavelength conversion layer.

A light source device according to a second aspect of the present disclosure includes the wavelength conversion element according to the first aspect described above, and a light source configured to emit the first light which enters the wavelength conversion element.

According to such a configuration, substantially the same advantages as those of the wavelength conversion element according to the first aspect described above can be exerted. Thus, it is possible to configure the light source device large in amount of light emitted.

A projector according to a third aspect of the present disclosure includes the light source device according to the second aspect described above, a light modulation device configured to modulate light emitted from the light source device in accordance with image information, and a projection optical device configured to project the light modulated by the light modulation device.

According to such a configuration, substantially the same advantages as those of the light source device according to the second aspect described above can be exerted. Thus, it is possible to achieve an increase in luminance of an image to be displayed on the projection target surface.

What is claimed is:

1. A wavelength conversion element comprising:
a wavelength conversion layer configured to convert first light in a first wavelength band into second light in a second wavelength band different from the first wavelength band, the wavelength conversion layer including a scattering element no higher than 5% in volume ratio and having a first surface, a second surface intersecting the first surface, and a third surface intersecting the second surface and different from the first surface;
an optical element including glass having a first refractive index lower than a second refractive index of the wavelength conversion layer, the optical element having contact with the first surface and the second surface; and
a low-refractive index layer having a third refractive index lower than the first refractive index of the glass, the low-refractive index layer having contact with the third surface.

2. The wavelength conversion element according to claim 1, wherein
the low-refractive index layer is a film having $SiO_2$ as a principal component.

3. The wavelength conversion element according to claim 1, wherein
the low-refractive index layer is a porous film having $SiO_2$ as a principal component.

4. The wavelength conversion element according to claim 1, wherein
the low-refractive index layer is a porous film having $CaF_2$ as a principal component.

5. The wavelength conversion element according to claim 1, further comprising:
a support body disposed at an opposite side to the wavelength conversion layer with respect to the low-refractive index layer, the support body being configured to support the wavelength conversion layer and the low-refractive index layer.

6. The wavelength conversion element according to claim 5, further comprising:
an optical layer including the wavelength conversion layer and the low-refractive index layer; and
a jointing layer including Si, the jointing layer being configured to joint the optical layer and the support body to each other.

7. The wavelength conversion element according to claim 1, further comprising:
a reflecting layer disposed at an opposite side to the wavelength conversion layer with respect to the low-refractive index layer, the reflecting layer being configured to reflect light entering the reflecting layer from a low-refractive index layer side.

8. The wavelength conversion element according to claim 7, wherein the reflecting layer is a metal film.

9. The wavelength conversion element according to claim 7, wherein the reflecting layer is a dielectric multilayer film.

10. The wavelength conversion element according to claim 1, wherein
the optical element is a reflector having a parabolic shape, the reflector being configured to collect the second light emitted from the wavelength conversion layer, and
the reflector is filled with the glass.

11. The wavelength conversion element according to claim 1, wherein
a difference in linear expansion coefficient between the glass included in the optical element and the wavelength conversion layer is no larger than $3.0 \times 10^{-6}$ in a temperature range from a softening point of the glass to a room temperature.

12. A light source device comprising:
a light source configured to emit the first light; and
the wavelength conversion element according to claim 1 which the first light emitted from the light source enters.

13. A projector comprising:
the light source device according to claim 12;
a light modulation device configured to modulate light emitted from the light source device in accordance with image information; and
a projection optical device configured to project the light modulated by the light modulation device.

* * * * *